(12) United States Patent
Cheng et al.

(10) Patent No.: US 10,236,364 B1
(45) Date of Patent: Mar. 19, 2019

(54) TUNNEL TRANSISTOR

(71) Applicant: International Business Machines Corporation, Armonk, NY (US)

(72) Inventors: Kangguo Cheng, Schenectady, NY (US); Peng Xu, Santa Clara, CA (US); Heng Wu, Guilderland, NY (US); Zhenxing Bi, Niskayuna, NY (US)

(73) Assignee: International Busines Machines Corporation, Armonk, NY (US)

( * ) Notice: Subject to any disclaimer, the term of this patent is extended or adjusted under 35 U.S.C. 154(b) by 0 days.

(21) Appl. No.: 16/016,477

(22) Filed: Jun. 22, 2018

(51) Int. Cl.
| H01L 21/336 | (2006.01) |
| H01L 29/66 | (2006.01) |
| H01L 29/45 | (2006.01) |
| H01L 23/528 | (2006.01) |
| H01L 21/768 | (2006.01) |
| H01L 29/08 | (2006.01) |
| H01L 29/78 | (2006.01) |
| H01L 21/84 | (2006.01) |

(52) U.S. Cl.
CPC .. *H01L 29/66977* (2013.01); *H01L 21/76816* (2013.01); *H01L 21/76877* (2013.01); *H01L 21/76897* (2013.01); *H01L 21/845* (2013.01); *H01L 23/528* (2013.01); *H01L 29/0847* (2013.01); *H01L 29/452* (2013.01); *H01L 29/456* (2013.01); *H01L 29/66545* (2013.01); *H01L 29/785* (2013.01)

(58) Field of Classification Search
CPC ............. H01L 29/66977; H01L 29/452; H01L 23/528; H01L 29/456; H01L 21/76816; H01L 21/76897; H01L 29/66545; H01L 29/0847; H01L 29/785; H01L 21/76877; H01L 21/845
See application file for complete search history.

(56) References Cited

U.S. PATENT DOCUMENTS 4,962,054 A 10/1990 Shikata
6,121,093 A 9/2000 Cheng et al.
(Continued)

FOREIGN PATENT DOCUMENTS

| CN | 104779292 A | 7/2015 |
| KR | 10-1682420 B1 | 12/2016 |
| WO | WO 2013075690 A3 | 5/2013 |

OTHER PUBLICATIONS

Machine translation of KR 10-1682420.
(Continued)

*Primary Examiner* — Savitr Mulpuri
(74) *Attorney, Agent, or Firm* — Vazken Alexanian; Otterstedt, Ellenbogen & Kammer, LLP

(57) ABSTRACT

A tunnel field-effect transistor having source and drain contacts made from different electrically conductive materials enables independent optimization of contact resistance on the source and drain sides of the transistor. Dielectric caps on the gate electrode, source contact and drain contact made from different materials allow the selective removal of portions of the caps during gate, source and drain wiring. A wiring strap can be formed across the gate and drain to electrically connect two source contacts together. Multiple drain contacts or multiple gate electrodes may alternatively be electrically connected by wiring straps. Strap wiring facilitates placing transistors in closer proximity to increase the number of transistors for a given chip area.

10 Claims, 6 Drawing Sheets

(56) References Cited

U.S. PATENT DOCUMENTS

| | | |
|---|---|---|
| 6,610,576 B2 | 8/2003 | Nowak |
| 7,585,735 B2 | 9/2009 | Mathew et al. |
| 7,768,006 B2 | 8/2010 | Zhu et al. |
| 8,138,030 B2 | 3/2012 | Chang et al. |
| 8,158,482 B2 | 4/2012 | Hoentschel et al. |
| 8,574,991 B2 | 11/2013 | Hoentschel et al. |
| 8,796,735 B2 | 8/2014 | Lauer et al. |
| 8,969,160 B2 | 3/2015 | Piao et al. |
| 9,040,960 B2 | 5/2015 | Chen et al. |
| 9,142,660 B2 | 9/2015 | Guo et al. |
| 9,362,383 B1 | 6/2016 | Balakrishnan et al. |
| 9,391,204 B1 | 7/2016 | Cheng et al. |
| 9,508,597 B1 | 11/2016 | Liu et al. |
| 9,543,435 B1 | 1/2017 | Basker et al. |
| 9,634,138 B1 | 4/2017 | Choi et al. |
| 9,659,942 B1 | 5/2017 | Basker et al. |
| 9,837,403 B1 | 12/2017 | Bi et al. |
| 9,905,647 B2 | 2/2018 | Fay et al. |
| 2002/0034854 A1 | 3/2002 | Lu et al. |
| 2012/0168832 A1 | 7/2012 | Anderson et al. |
| 2016/0056278 A1 | 2/2016 | Avci et al. |
| 2017/0084726 A1 | 3/2017 | Balakrishnan et al. |

OTHER PUBLICATIONS

IBM, Tunnel FET with Intermediate Tunneling Layer (TFITL), IP.com, No. IPCOM000187376D, Sep. 3, 2009.

Wang, Wei et al., Design of U-Shape Channel Tunnel FETs With SiGe Source Regions, IEEE Transactions on Electronic Devices, vol. 61, No. 1, Jan. 2014.

English translation of abstract of CN 104779292.

Goel, Ashish et al., Asymmetric Drain Spacer Extension (ADSE) FinFETs for Low-Power and Robust SRAMs, IEEE Transactions on Electron Devices, vol. 58, No. 2, pp. 296-308, Feb. 2011.

Kangguo Cheng, unpublished U.S. Appl. No. 16/016,454 Transistor With Asymmetric Source/Drain Overlap, filed Jun. 22, 2018, pp. 1-26 plus 6 sheets drawings.

Zhenxing Bi, unpublished U.S. Appl. No. 15/808,869 Transistor With Asymmetric Spacers, filed Nov. 9, 2017, pp. 1-29 plus 6 sheets drawings.

Paul J. Otterstedt, List of IBM Patents or Patent Applications Treated as Related, Oct. 5, 2018, 2 Pages.

Zhenxing Bi, unpublished U.S. Appl. No. 16/159,673 Transistor With Asymmetric Spacers, filed Oct. 14, 2018, pp. 1-28 plus 6 sheets drawings.

Paul J. Otterstedt, List of IBM Patents or Patent Applications Treated as Related, Oct. 24, 2018, pp. 1-2.

TUNNEL TRANSISTOR

BACKGROUND

The present invention relates generally to the electronic arts and, more particularly, to tunnel field-effect transistors (TFETs) and their fabrication.

Tunnel field-effect transistors are similar in structure to metal oxide semiconductor field-effect transistors (MOSFETs), but require asymmetric source and drain regions that have opposite conductivity types. One conventional TFET device structure contains a P-I-N (p-type-intrinsic-n-type) junction, where the electrostatic potential of the intrinsic region is controlled by a gate terminal. By forming TFET heterojunctions using different materials, TFET performance can be improved.

TFETs have the potential to serve as a viable option for extremely low power applications. However, given the TFET requirements of different source and drain polarities, it can be challenging to form the different source and drain regions with a small gate length. The use of conventional photolithography may involve patterning one of the source and drain sides of the device and processing the other side thereof. Such an approach may create overlay/misalignment problems, particularly in devices having relatively small gate lengths. This is due at least to the presence of a reduced process window for mask placement with the small gate length.

BRIEF SUMMARY

Tunnel field-effect transistor structures and techniques for fabricating such structures are disclosed.

In one aspect, an exemplary tunnel field-effect transistor device includes a semiconductor substrate including a first region, a second region, and a channel region between the first and second regions. A first gate electrode is operatively associated with the channel region and a first gate dielectric layer is located between the first gate electrode and the channel region. A first doped epitaxial source region is on the first region of the semiconductor substrate and has a first conductivity type. A doped epitaxial drain region is on the second region of the semiconductor substrate and has a second conductivity type opposite from the first conductivity type. A first source contact is electrically connected to the first source region and a drain contact is electrically connected to the drain region. The first source contact and the drain contact comprise different electrically conductive materials. A first source contact cap is on the first source contact and comprises a first dielectric material. A drain contact cap on the drain contact comprises a second dielectric material different from the first dielectric material. A first gate cap over the first gate electrode cap is comprised of a third dielectric material different from the first and second dielectric materials.

In another aspect, an exemplary method of fabricating a tunnel field-effect transistor device includes obtaining a structure including a semiconductor substrate and a plurality of vertically extending mandrels on the semiconductor substrate, forming dummy gates on sidewalls of the mandrels, and removing the mandrels after forming the dummy gates, thereby forming first vertical trenches between pairs of the dummy gates. First and second epitaxial source regions are formed on the semiconductor substrate and have a first conductivity type. First and second source contacts are formed within the first vertical trenches, the source contacts being electrically connected to the first and second epitaxial source regions and comprising a first electrically conductive material. First and second source contact caps comprising a first dielectric material are formed on the first and second source contacts. An epitaxial drain region is formed on the semiconductor substrate and has a second conductivity type opposite from the first conductivity type. A drain contact is formed on the epitaxial drain region and comprises a second electrically conductive material different from the first electrically conductive material. A drain contact cap comprising a second dielectric material different from the first dielectric material is formed on the drain contact. The dummy gates are removed and a gate dielectric layer is deposited over a channel region of the semiconductor substrate. A first gate electrode is formed on the gate dielectric layer and a first gate cap is formed over the first gate electrode. The first gate cap comprises a third dielectric material different from the first and second dielectric materials used to form the source contact caps and the drain contact cap.

A further method of fabricating a tunnel field-effect transistor device includes obtaining a monolithic structure including one or more tunnel field-effect transistors. The monolithic structure further includes a plurality of source contact caps respectively on a plurality of source contacts. The source contact caps comprise a first dielectric material. A plurality of drain contact caps are respectively on a plurality of drain contacts. The drain contact caps comprise a second dielectric material different from the first dielectric material. A plurality of gate caps is respectively positioned over a plurality of gate electrodes. The gate caps are comprised of a third dielectric material different from the first and second dielectric materials. The method further includes depositing an interlevel dielectric layer over the source contact caps, the drain contact caps, and the gate caps, forming a first wiring trench in the interlevel dielectric layer, selectively removing portions of at least one of the source contact caps, the drain contact caps and the gate caps using a first selective etch selective to one of the first, second and third dielectric materials; and depositing wiring metal within the first wiring trench. The deposited wiring metal is electrically connected by at least one of the source contacts, the drain contacts and the gate electrodes to at least one of the one or more field-effect tunnel transistors.

Techniques and devices as disclosed herein can provide substantial beneficial technical effects. By way of example only and without limitation, one or more embodiments may provide one or more of the following advantages:

Precise overlay of source/drain patterning mask over a small gate not required;
Self-aligned sidewall image transfer (SIT) process enables asymmetry;
Small gate lengths and heterojunctions;
Source and drain contacts formed using different materials, allowing contact resistances between the contacts and the source and drain to be independently minimized;
Different dielectric caps formed on source, drain and gate, enabling wiring common terminals together with one contact wiring and thereby allowing greater transistor density.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of an illustrative tunnel field-effect transistor fabricated on a silicon substrate. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The figures schematically illustrate an exemplary sequence of fabrication steps that may be employed in obtaining a tunnel field-effect transistor (TFET). Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. While some individual processing steps are set forth herein, those steps are merely illustrative, and one skilled in the art may be familiar with several equally suitable alternatives that would be applicable.

Figure 1:
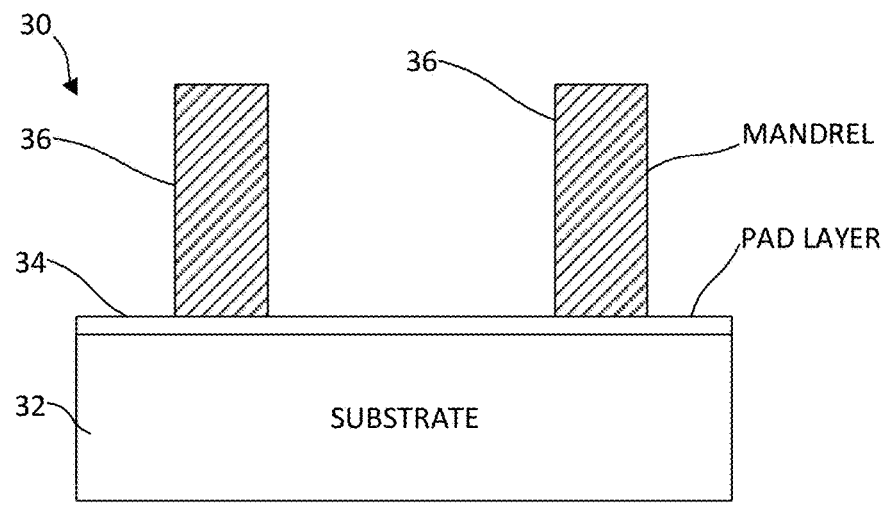
FIG. 1 is a schematic, cross-sectional view depicting a finned semiconductor substrate having mandrels formed thereon.

With reference now to the structure 30 shown in FIG. 1, a bulk silicon wafer 32 is employed as the substrate in some embodiments. The substrate consists essentially of monocrystalline silicon in one or more embodiments. Single crystal silicon wafers are commercially available and are characterized by a diamond cube lattice structure. As known in the art, the Miller indices of a substrate are determined from the reciprocals of the points at which the crystal plane of silicon intersects the principle crystalline axes. While some exemplary embodiments relate to structures including essentially undoped (100) silicon as a substrate material, it will be appreciated that the principles expressed are applicable to other semiconductor substrates and substrates with crystallographic orientations other than (100). For example, substrates such as semiconductor-on-insulator (SOI) substrates as well as bulk substrates can be employed in accordance with the teachings herein. Active regions are electrically isolated on the substrate. The active regions on which the TFETs are to be formed may be planar, finned, or include stacked nanowires or nanosheets.

Referring again to FIG. 1, a pad layer 34 such as a pad oxide or pad nitride layer is formed on the substrate. As known in the art, a thin silicon oxide or silicon nitride layer can be grown on a silicon wafer as a protective layer to facilitate downstream processes. Electrically isolated active regions are then formed from the substrate by techniques such as shallow trench isolation (STI). Each active region can comprise planar semiconductor structures, fin structures, nanowires, nanosheets, or any other suitable semiconductor materials.

Vertical mandrels 36 are formed on the substrate. The sacrificial mandrels may comprise, for example, amorphous silicon (a-Si) or polycrystalline silicon (polysilicon). The sacrificial material comprising the mandrels may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), atomic layer deposition (ALD), or any combination thereof. Hydrogenated amorphous silicon is typically deposited by plasma-enhanced chemical vapor deposition (PECVD) although other techniques such as hot-wire chemical vapor deposition (HWCVD) may be used. A layer of such sacrificial material is patterned to obtain discrete mandrels having substantially vertical side walls. A patterned mask (not shown) including openings corresponding to the mandrel locations may be formed on the layer of sacrificial material. The sacrificial material is then subjected to a reactive ion etch to remove the sacrificial material between the mandrels 36 down to the pad layer 34, which functions as an etch stop. The mandrels 36 may or may not have the same width. In some embodiments, mandrel width is in the range of ten to fifty nanometers (10-50 nm) and mandrel height is fifty to one hundred fifty nanometers (50-150 nm). Mandrel dimensions are exemplary and not limiting.

Figure 2:
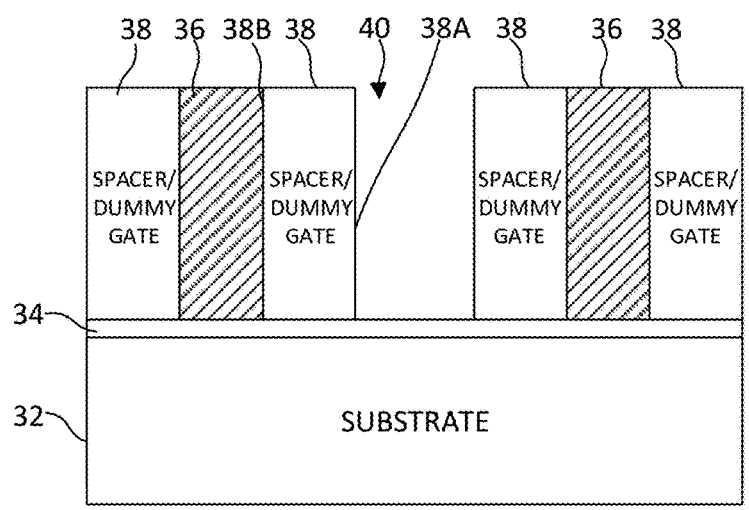
FIG. 2 is a cross-sectional view showing the structure of FIG. 1 following formation of dummy gate spacers on the mandrels.

Referring to FIG. 2, spacers/dummy gates 38 are formed on the mandrel sidewalls. Silicon nitride spacers/dummy gates are formed in some embodiments. A silicon nitride layer can be deposited via CVD, PECVD, sputtering, or other suitable technique to form the spacers. Amorphous carbon spacers/dummy gates are formed on the mandrel sidewalls in other embodiments using chemical vapor deposition (CVD) or other suitable process. The material chosen for spacer/dummy gate formation should be compatible with subsequent processing steps as described below. Spacer/dummy gate thickness is between ten and fifty nanometers (10-50 nm) in some embodiments. The spacers can be formed by any method known in the art, including depositing a conformal layer over the substrate and mandrels 36 and removing unwanted material using an anisotropic etching process such as reactive ion etching or plasma etching. The resulting structure includes trenches 40 between each set of mandrels and adjoining spacers/dummy gates and extending down to the pad layer 34. The trenches 40 may or may not have equal widths. Trench width can be in the range of ten to fifty (10-50 nm) in the exemplary embodiments.

Figure 3:
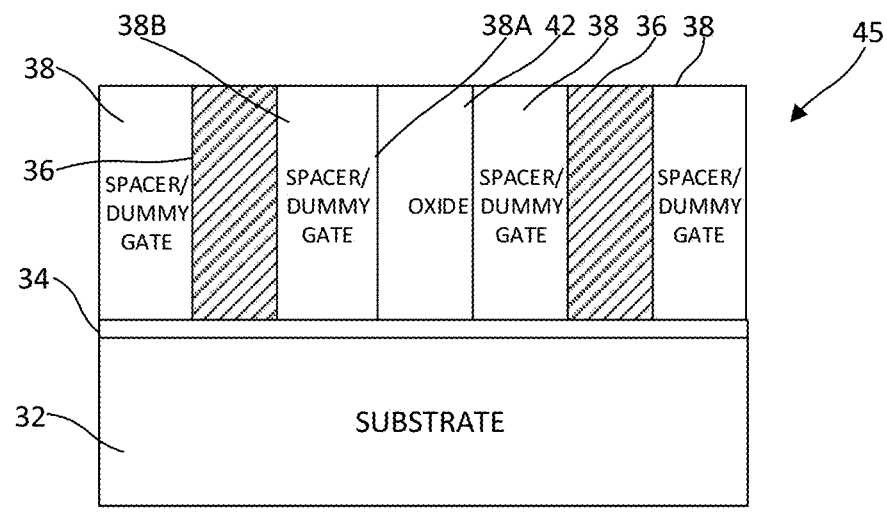
FIG. 3 is a schematic, cross-sectional view showing the structure of FIG. 2 following deposition of fill material between the spacers.

A filler material is deposited in the trenches 40 in obtaining a structure as schematically illustrated in FIG. 3. The filler material adjoins the drain sides 38A of the dummy gates while the mandrels 36 adjoin the source sides 38B thereof. The filler material is different in composition from the materials comprising the mandrels 36 and spacers/dummy gates 38, which allows for selective etching thereof. Non-limiting examples of materials for the filler layers 42 include amorphous carbon, silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The resulting structure is planarized, for example by chemical mechanical planarization (CMP), to obtain the structure shown in FIG. 3. The heights of the mandrels 36, spacers/dummy gates 38 and filler layers 42 comprising the structure are substantially the same. As discussed further below, the regions occupied by adjoining mandrels 36, spacers/dummy gates 38 and filler layers 42 can later be employed to form source, gate and drain regions of asymmetric field-effect transistors. The spacers/dummy gates 38 may accordingly be employed as dummy gates that are replaced by metal gate material during subsequent processing. The dummy gates have source sides and drain sides.

Figure 4:
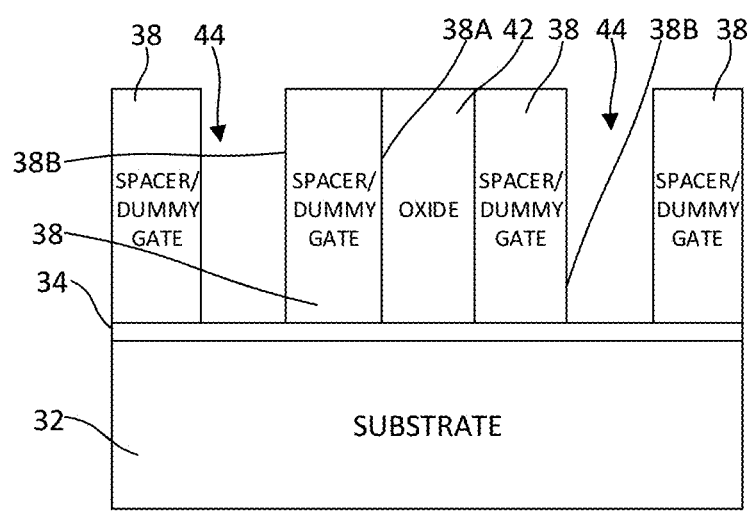
FIG. 4 is a schematic, cross-sectional view thereof following removal of the mandrels from the structure shown in FIG. 3.

The mandrels 36 are removed to form a structure as shown in FIG. 4. In embodiments including amorphous silicon mandrels, a wet etch using hot ammonia can be employed to selectively remove the mandrels while leaving the spacers/dummy gates 38 and the oxide layers 42, 34 substantially intact. Trenches 44 are accordingly formed between selected pairs of spacers/dummy gates 38.

The pad oxide layer is removed from the bottoms of the trenches 44 using, for example, a wet etching process including a hydrofluoric (HF) acid mixture. The substrate 32 is then subjected to a wet etching process to further extend the trenches 44 vertically and laterally in the portions of the substrate to be employed for growing source regions. The lateral undercut is optional. In embodiments where lateral undercutting is deemed unnecessary, a vertical recess can be formed by a directional etch such as reactive ion etch (RIE) process. If both vertical and lateral etching are desired, either a single isotropic etch, or a combination of anisotropic etch and isotropic etch can be used. The adjoining dummy gates 38 and remaining portions of the pad oxide layer function as an etch mask during etching of the substrate.

Recesses 44' within the semiconductor substrate can be formed using an anisotropic etching (e.g., reactive ion etch (RIE)), an isotropic etch (e.g., chemical downstream etch) or a combination of both isotropic and anisotropic etching. The recesses can be bowl shaped, sigma shaped, or other shape configuration as a result of the chosen recess process(es). A wet etch containing ammonia ($NH_4OH$) may, for example, be employed for the isotropic etching of silicon. Alternatively, a RIE process can be used to vertically recess Si fins. Optionally, this process is timed so that the substrate is laterally etched by about 3-10 nm beneath the dummy gates, so that the edges of the recesses 44' after the pullback are located under the dummy gates 38 and the portions of the pad oxide layer 34 beneath the dummy gates. The depths of the recesses 44' may be between twenty and sixty nanometers (20-60 nm).

Figure 5:
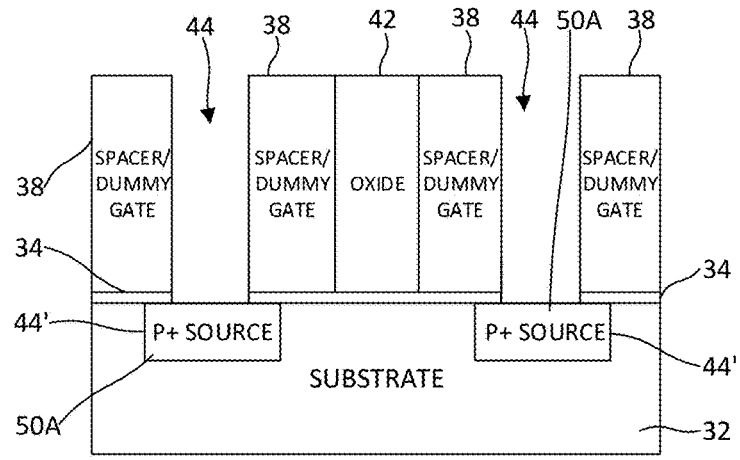
FIG. 5 is a schematic, cross-sectional view of the structure of FIG. 4 following etching of the substrate to form recesses in the substrate and epitaxial growth of source regions within the recesses.

Referring again to FIG. 5, source regions 50A are epitaxially grown on the substrate. The source regions are aligned with the trenches 44 formerly containing the mandrels and fill the laterally enlarged recesses 44' within the substrate. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The dopants within the source regions may be incorporated in situ using appropriate precursors, as known in the art. By "in situ" it is meant that the dopant that dictates the conductivity type of a doped layer is introduced during the process step, e.g., epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous.

Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). In some embodiments, a portion or all dopants can be incorporated in source/drain regions by other suitable doping technique, including but not limited to, ion implantation, gas phase doping, plasma doping, plasma immersion, ion implantation, cluster doping, infusion doping, liquid phase doping, solid phase doping, or any suitable combination of those doping techniques. A semiconductor material having a relatively low bandgap may be selected to function as the source regions 50A of the TFET to be fabricated. Silicon germanium (SiGe) may be employed as source material in silicon-based devices. If III-V TFETs are to be fabricated, indium arsenide (InAs) may be grown to form the source regions.

Figure 6:
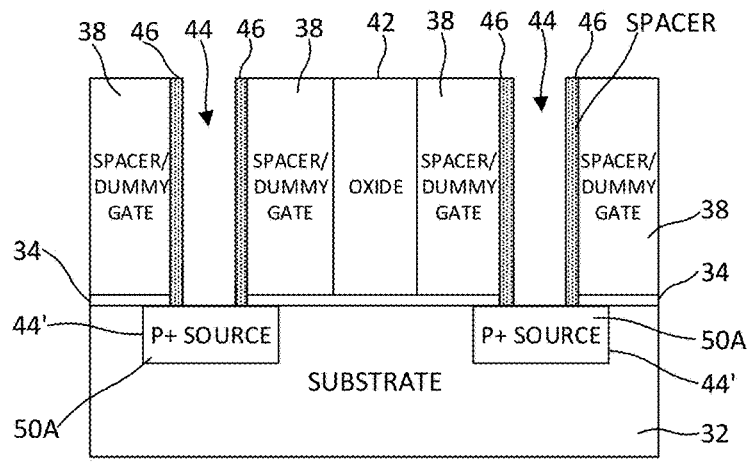
FIG. 6 is a schematic, cross-sectional view thereof following formation of sidewall spacers on the dummy gates above the source regions.

A set of dielectric sidewall spacers 46 is formed on the sidewalls of the dummy gates on the source sides thereof, as schematically illustrated in FIG. 6. The dielectric sidewall spacers 46 may consist essentially of, for example silicon oxide, silicon oxynitride, silicon nitride, SiBCN (silicon-borocarbonitride) or SiOCN (siliconoxycarbonitride), SiOC (siliconoxycarbide). A conventional spacer formation process, namely, a conformal deposition process (e.g., ALD or CVD) followed by an anisotropic etch process (e.g., RIE) that acts to remove the just-deposited material from the horizontal surfaces, may be employed to form the sidewall spacers 46. Sidewall spacer thickness is between one and three nanometers (4-8 nm) in some embodiments. The sidewall spacers 46 line the walls of the trenches 44 and adjoin the top surfaces of the source regions 50A.

Self-aligned source contacts 62S are formed by depositing metals such as aluminum and tungsten in the spacer-lined trenches 44. The dummy gates and fill material protect the regions to be employed for gate and drain fabrication during formation of the source contacts 62S. The source contacts 62S are formed using any suitable metallization processes. Electrically conductive material(s) can be deposited in the trenches 44 followed by planarization to form source contacts. Contact material may, for example, include tantalum (Ta), aluminum (Al), platinum (Pt), gold (Au), tungsten (W), titanium (Ti), cobalt (Co), nickel (Ni), palladium (Pd), or any combination thereof. Nickel platinum (NiPt) is deposited in one exemplary embodiment wherein the source region 50A consists essentially of silicon germanium. The contact material may be deposited by, for example, CVD, PECVD, PVD, plating, thermal or e-beam evaporation, or sputtering. The contact material may include a liner on trench sidewalls before filling the rest of the trench with an electrically conductive metal. Non-limiting liner materials include titanium nitride (TiN), tantalum nitride (TaN), and nickel platinum (NiPt). In an exemplary embodiment wherein the source 50A is SiGe doped with p-type dopants, the contact 62 comprises NiPt liner on top of the SiGe source and trench sidewalls. The remainder of the trench can be filled with an electrically conductive material such as tungsten or cobalt. The NiPt accordingly serves as two purposes: (1) liner for a contact metal such as tungsten to fill the contact trench, and (2) NiPt on top of p-type doped SiGe to form low contact resistance interface. A planarization process such as CMP is performed to remove any conductive material from the top surface of the structure shown in FIG. 7. Insulator caps 60S are formed on top of the source contacts 62S. The formation of the insulator caps 60S follows recessing of the source contacts 62S. An electrically insulating material is deposited on the structure and then planarized to obtain the structure shown in FIG. 7. In one exemplary embodiment, the insulator contact caps 60S on the source contacts 62S consist essentially of SiC.

Figure 8:
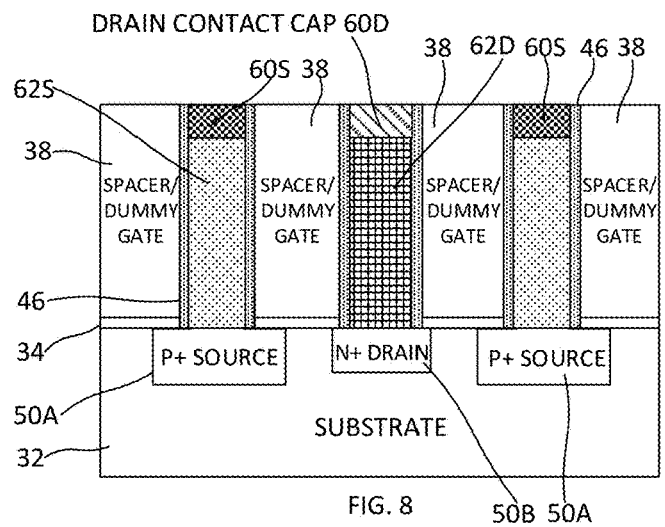
FIG. 8 is a schematic, cross-sectional view of the structure shown in FIG. 7 following formation of a drain region, a drain contact and a dielectric cap on the drain contact.

The filler layers 42 between the drain sides of the spacers/dummy gates 38 are removed to form trenches 48 extending down to the portions of the substrate 32 used for growing drain regions, as shown in FIG. 8. A selective etch may be employed to remove the filler material, leaving the spacers/dummy gates 38 substantially intact. In one embodiment, the filler layer 42 comprises amorphous carbon that can be selectively etched, for example, by ozone gas etching, or by oxygen plasma etching. Alternatively, amorphous carbon can be selectively etched by wet etch containing sulfuric acid and peroxide. If the filler layer 42 is oxide, it and the underlying portions of the pad oxide layer 34 can, for example, be selectively etched using $CHF_3$/Ar plasma or a wet etch containing hydrofluoric acid.

Drain regions 50B are epitaxially formed directly on the portions of the substrate 32 exposed by the trenches. The drain regions have conductivity types opposite from the conductivity types of the source regions that are operatively associated therewith. For example, if the source regions are p+, the drain regions are n+. The substrate is optionally recessed to extend the trenches prior to growing the drain regions. If recesses are formed in the substrate prior to the growth of both the source and drain regions, the recesses in which the source regions are grown are preferably deeper and extend further laterally than those in which the drain regions are grown. Sidewall spacers 46 and drain contacts 62D are then formed on the drain sides of the dummy gates. The drain regions 50B and the drain contacts 62D comprise different compositions than those comprising the source regions and source contacts, respectively, in some embodiments. The use of different materials, as permitted by the disclosed process, facilitates independent optimization of contact resistance on the source side and on the gate side of the device. In one exemplary embodiment including silicon germanium source regions 50A, the drain regions 50B consist essentially of n-type doped silicon. Silicon has a larger bandgap than SiGe (source side). In the case that the drain region is silicon (Si) doped with n-type dopants, the contact 62D can include a titanium (Ti) liner on top of the Si drain region and trench sidewalls. The remainder of the trench (40 in FIG. 3) can be filled with an electrically conductive material such as tungsten or cobalt. In other words, the Ti liner serves two purposes: (1) liner for the metal (e.g. tungsten) to fill the contact trench, and (2) Ti on top of n-type doped silicon to form a low contact resistance interface.

The drain contacts 62D are recessed and dielectric drain contact caps 60D are formed on the drain contacts to obtain a structure as schematically illustrated in FIG. 8. The drain contact caps 60D comprise a dielectric material different from those employed for the source contact caps 60S to allow selective etching. In one exemplary embodiment, the drain contact caps comprise SiOC.

Source/drain junctions can be formed by dopant diffusion from the source/drain epitaxy (regions 50A, 50B) into the semiconductor substrate 32. Techniques such as rapid thermal anneal (RTA), flash anneal, laser anneal, or any suitable combination of those annealing techniques, may be employed to cause dopant diffusion and formation of source/drain junctions. The junctions extend laterally from the source and drain regions. Thermal annealing causes the diffusion of dopants from doped source/drain regions towards channel to form gate-to-source/drain overlapping. The dopant diffusion anneal can be performed immediately after source/drain formation or after high-k gate dielectric formation. In practice, a high thermal budget anneal after gate metal formation is typically avoided.

The spacers/dummy gates 38 and the portions of the pad oxide layer 34 beneath the dummy gates are removed from the structure shown in FIG. 8 as part of a replacement metal gate (RMG) process. If the spacers/dummy gates 38 are amorphous carbon, they can be removed by using oxygen plasma or ozone etch. If the spacers/dummy gates are silicon nitride, they can be removed either using a wet etch (e.g., aqueous solution containing phosphoric acid) or dry etch (e.g., a plasma containing $SF_6/CH_4/N_2/O_2$ plasma).

A gate dielectric layer 56 forms portions of the gate stacks that replace the spacers/dummy gates 38 for the asymmetric TFETs to be fabricated. The gate dielectric layer 56 adjoins the sidewall spacers 46 and the channel regions within the semiconductor substrate and between the source and drain regions 50A, 50B. Non-limiting examples of suitable materials for the gate dielectric layer 56 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 56 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

Figure 9:
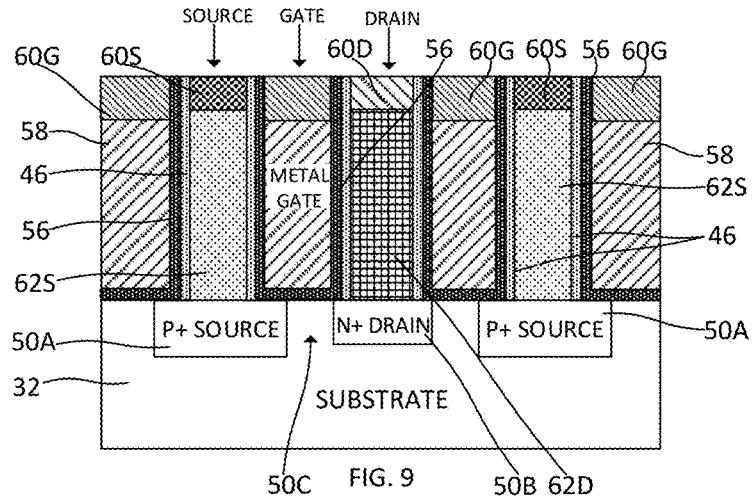
FIG. 9 is a schematic, cross-sectional view following removal of the dummy gates and formation of replacement metal gates in the structure shown in FIG. 8.

Electrically conductive gate material is deposited in the regions formerly containing the spacers/dummy gates 38. The deposited metal gate material forms the metal gates 58 of the tunnel field-effect transistors and is deposited on the gate dielectric layer 56, as shown in FIG. 9. The metal gates 58 include a source side and a drain side. The metal gates 58 overlap portions of the laterally enlarged source regions 50A in some embodiments. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, thermal or e-beam evaporation, or sputtering. A planarization process, for example, chemical mechanical planarization (CMP), is performed to polish the top surface of the deposited gate metal material. The asymmetry of the source and drain regions formed using the process described above results in less gate/junction overlap on the drain side of the device and relatively greater gate/junction overlap on the source side of the device.

In some embodiments, the electrically conductive gates can include a work function metal (WFM) layer (not shown) disposed between the gate dielectric layer and another electrically conductive metal gate material. The WFM sets the transistor characteristics such as threshold voltage (Vt) to a predetermined value. In some embodiments, the WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, ALD, CVD, PECVD, PVD, plating, thermal or e-beam evaporation, and sputtering.

The gate metal and adjoining gate dielectric/WFM layers are recessed to form cavities between the spacers 46. A timed directional reactive ion etch may be employed to perform etch-back of the gate metal. A mask (not shown) may be applied and patterned prior to etching portions of the structure. The recesses above the gate metal are filled with a dielectric material different from the dielectric materials comprising the source and drain contact caps 60S, 60D to form dielectric caps 60G that can protect the metal gates during subsequent wiring of the TFETs as discussed further below. The caps 60G may be formed from a material such as silicon nitride to provide the requisite selectivity for the subsequent processing of the structure 90. After deposition, the dielectric cap material is planarized to remove it from the surface of the structure. The dielectric cap material remains within the recesses above the gate metal following planarization.

Figure 10:
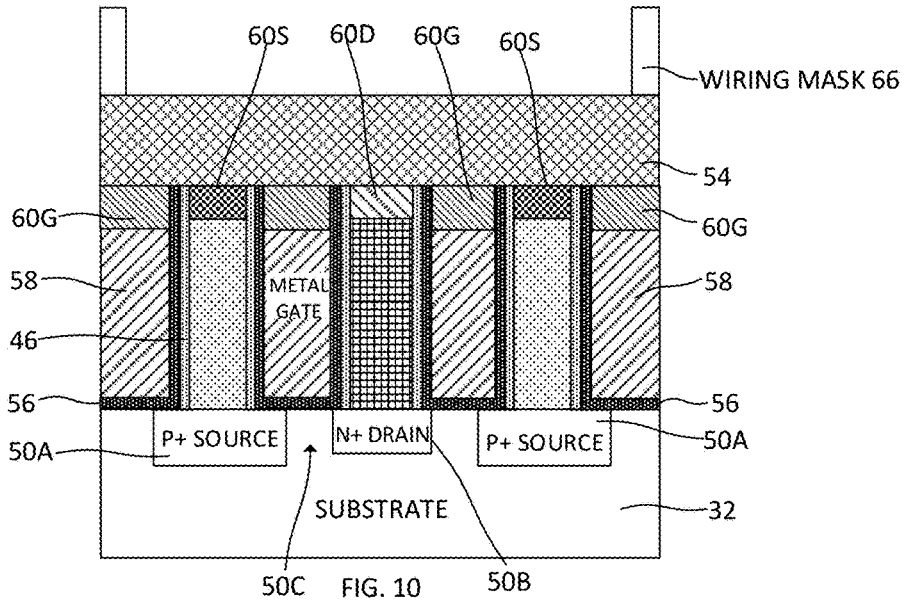
FIG. 10 is a schematic, cross-sectional view following deposition of an interlevel dielectric (ILD) layer and a source mask on the structure shown in FIG. 9.

Referring to FIG. 10, an interlevel dielectric (ILD) layer 54 is deposited as a blanket layer on the structure 90 shown in FIG. 9. The ILD layer 54 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. In some embodiments, ILD layer 54 may comprise a single layer (e.g., oxide) or multiple layers. The ILD layer is planarized using chemical mechanical planarization (CMP), as known in the art, to obtain a structure having a planar top surface.

Figure 11:
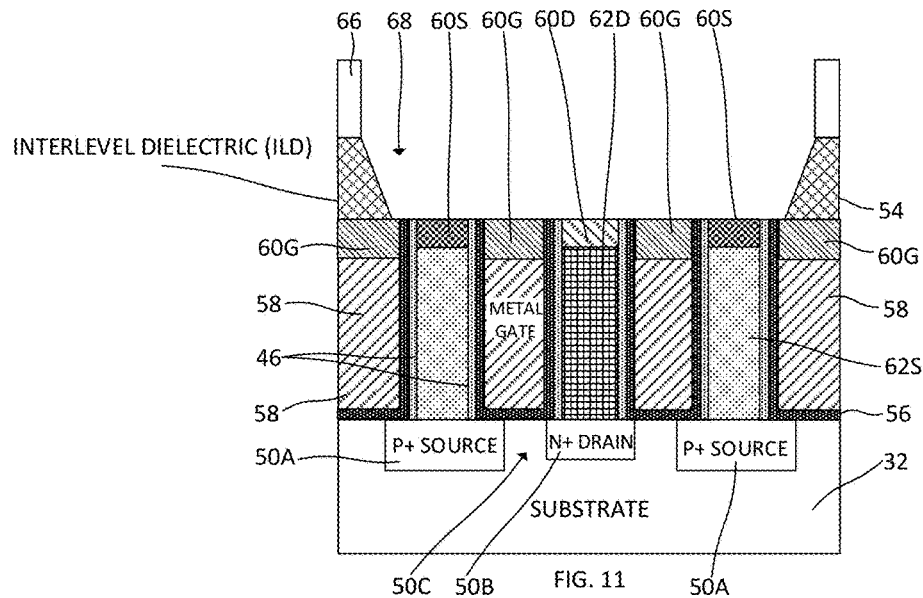
FIG. 11 is a schematic, cross-sectional view thereof following patterning of the ILD layer.

A wiring mask 66 is deposited on the planarized top surface of the ILD layer 54 and patterned. A photoresist layer can be applied by any suitable technique, including, but not limited to coating or spin-on techniques. A mask (not shown), which is patterned with shapes defining trench openings to be formed, is provided over the photoresist layer, and the mask pattern is transferred to the photoresist layer using a photolithographic process, which creates recesses in the uncovered regions of the photoresist. The patterned photoresist layer which forms the wiring mask 66 is subsequently used to create the same pattern of recesses in the ILD layer 54 through conventional etching typically used for forming trenches. A dry etch (for example, a reactive ion etch) may be employed to selectively removes a portion of the ILD layer. The source wiring mask 66 is employed to etch through the ILD layer 54, landing on all the caps 60S, 60G, 60D as shown in FIG. 11. Etching down to the dielectric caps 60S, 60G, 60D forms a first wiring trench 68 in the ILD layer having dimensions corresponding to the dimensions of a source wiring strap that is later formed. Patterning of the ILD layer may, for example, include subjecting the ILD layer to a reactive ion etch containing a $CHF_3/Ar$ plasma.

Figure 12:
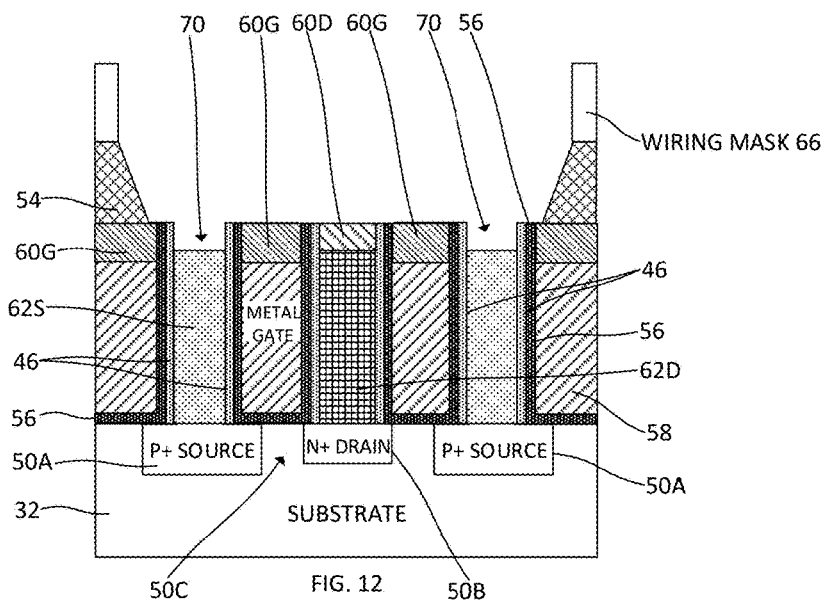
FIG. 12 is a schematic, cross-sectional view thereof following selective etching of the source caps.

Referring to FIG. 12, portions of the source contact caps 60S aligned with the first wiring trench 68 in the ILD layer are removed selective to the gate and drain caps 60G, 60D using a reactive ion etch. The use of different cap materials allows such selectivity. Recesses 70 above the top surfaces of the source contacts 62S and between the sidewall spacers 46 are formed following removal of source cap material. The photoresist (wiring mask 66) may be stripped by ashing or other suitable process from the ILD layer. The resulting structure may be subjected to a wet clean.

Figure 13:
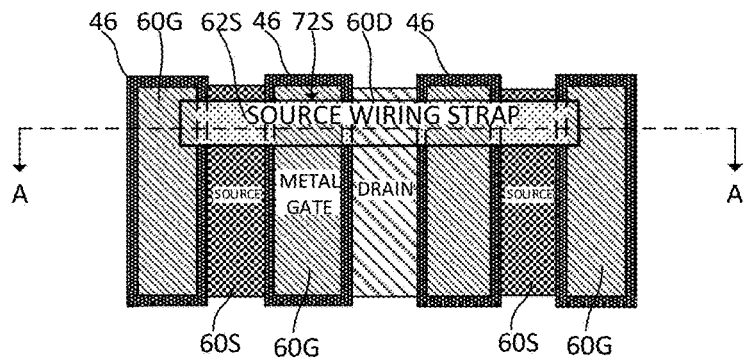
FIG. 13 is a top plan view thereof following removal of the source mask and forming a source wiring strap on the structure shown in FIG. 12.

A conformal layer of liner material (not shown) is deposited within the opening 68 in the ILD layer and lines the sidewall and bottom surfaces of the opening(s) within the ILD layer. The liner material may include one or more thin layers of material such as, for example, tantalum (Ta), tantalum nitride (TaN), titanium nitride (TiN), cobalt (Co), tungsten (W), tungsten nitride (WN), titanium-tungsten (TiW), tungsten nitride (WN) manganese (Mn), manganese nitride (MnN) or other liner materials (or combinations of liner materials) suitable for a given application. The thin liner serves as a barrier diffusion layer and adhesion layer. The conformal layer of liner material is deposited using known techniques such as CVD, ALD, or PVD. A thin conformal metal seed layer can be deposited over the surface of the liner using PVD. Source wiring metal is deposited to fill the wiring trenches 68 in the ILD layer and the recesses 70 above the source contacts 62S. The source wiring metal may include copper (Cu), and consists essentially of elemental copper in some embodiments. Copper alloys such as Cu(Al) may alternatively be employed. Copper may be deposited using, for example, chemical vapor deposition, physical vapor deposition plus reflow, or electrochemical deposition (e.g. electroplating). The overburden liner, seed, and metallization materials are then removed by performing a three step chemical mechanical polishing process (CMP) to planarize the surface of the semiconductor structure down to the ILD layer 54. A metal cap layer may be selectively deposited on the exposed metal layer within the trenches 68. For example, metals such as cobalt, ruthenium or manganese may be deposited using chemical vapor deposition or atomic layer deposition to form the cap layer. The source wiring layer comprises the metal layer and the underlying seed layer. The barrier layer deposited prior to the wiring layer fill helps prevent the diffusion of wiring metal into the surrounding dielectric material. A source wiring strap 72S that electrically connects two source regions 50A is accordingly obtained, as shown in FIGS. 13 and 13A.

Processes similar to the formation of the source wiring strap 72S are employed to form a structure 100 including gate wiring and drain wiring 72G, 72D. The gate and drain wiring may be configured for electrical connection to individual gate and drain elements as shown in the figures and described below. In other embodiments, multiple drains or multiple gates are connected by wiring straps formed similarly to the source wiring strap 72S. Formation of the drain wiring 72D involves forming a further trench in the ILD layer and removing a portion of the drain contact cap 60D selective to the adjoining gate wiring caps over which the further trench extends. The resulting drain wiring trench is filled with wiring metal. Formation of the gate wiring 72G involves the formation of an additional trench in the ILD layer using a gate wiring mask, removal of a portion of the gate contact cap 60G selective to the adjoining source and drain contact caps 60S, 60D and filling the resulting gate wiring trench with wiring metal. As indicated above, the trenches formed in the ILD to form the drain and gate wiring extend laterally beyond the drain and gate caps as shown in FIG. 13, which is permissible in view of the different dielectric materials employed forming the dielectric caps. This is beneficial in that great precision is not required in forming the gate and drain trenches in the ILD layer.

Figure 13A:
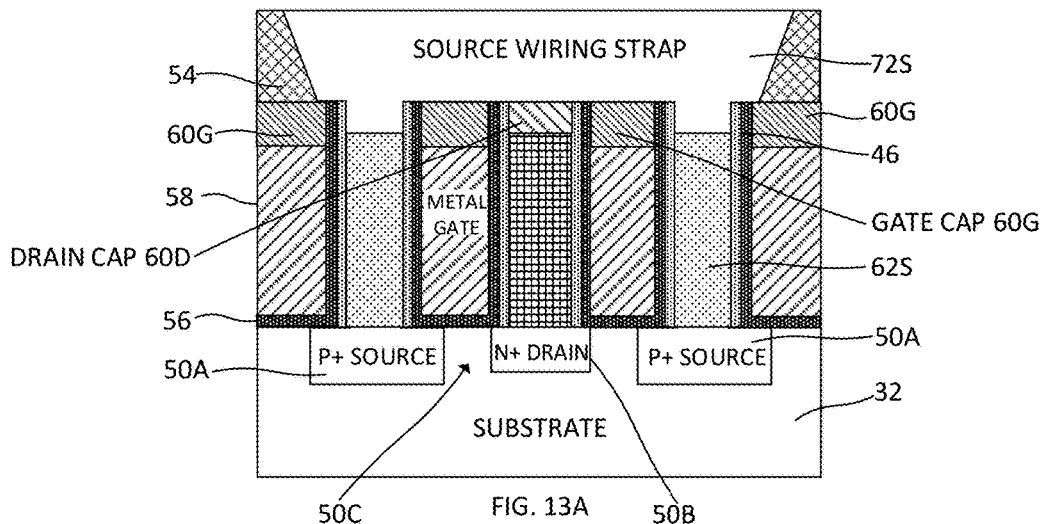
FIG. 13A is a schematic, cross-sectional view thereof taken along the plane of line A-A in FIG. 13.
Figure 14:
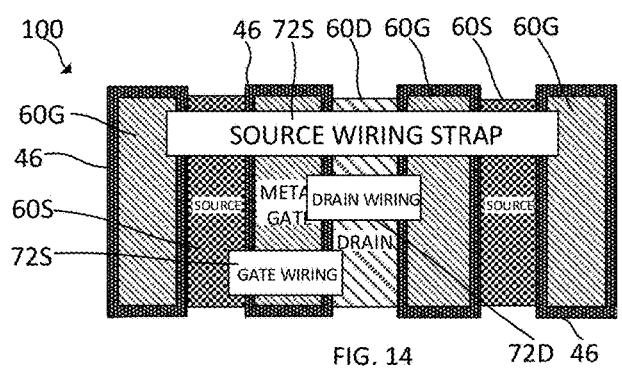
FIG. 14 is a top plan view following formation of drain wiring and gate wiring on the structure shown in FIG. 13.

FIG. 13A shows the positioning of the drain and gate wiring prior to selective cap removal and metal deposition. FIG. 14 shows a completed structure 80 that includes a source wiring strap 72S, drain wiring 72D and gate wiring 72G formed within the ILD layer. These elements extend within trenches formed above the source and drain contacts 62S, 62D and gate metal 58, respectively, and are electrically connected to the source and gate regions 50A, 50B and the metal gate 58. The tunnel transistor within the structure is configured to provide band-to-band tunneling in the "on" state while the band gap between valence and conduction bands blocks tunneling current while in the "off" state.

It will be appreciated that materials other than those described herein can be employed in the formation of tunnel field-effect transistors having the features described above. The techniques and concepts disclosed herein can be applied in the fabrication of various types of field-effect transistors, including planar transistors and non-planar transistors (e.g. FinFETs). In embodiments wherein FinFET devices are formed, the channels 50C are portions of monolithic semiconductor fins.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary tunnel field-effect transistor device includes a semiconductor substrate 32 including a first region, a second region, and a channel region 50C between the first and second regions. A first gate electrode 58 is operatively associated with the channel region and a first gate dielectric layer 56 is between the first gate electrode and the channel region. A first doped epitaxial source region 50A is on the first region of the semiconductor substrate and has a first conductivity type, for example p+. A doped epitaxial drain region is on the second region of the semiconductor substrate and has a second conductivity type opposite from the first conductivity type, for example n+. A first source contact 62S is electrically connected to the first source region 50A and a drain contact 62D is electrically connected to the drain region 50B. The first source contact and the drain contact comprise different electrically conductive materials A first source contact cap 60S is on the first source contact and a drain contact cap 60D is on the drain contact. The drain contact cap comprises a dielectric material different from that used in the first dielectric material to facilitate selective etching. A first gate cap 60G is over the first gate electrode 58 and comprises a third dielectric material different from the dielectric materials comprising the source and drain caps. An exemplary TFET is shown in FIG. 9. The tunnel field-effect transistor device may further include a source wiring strap 72S electrically connecting first and source contacts. The source wiring strap overlaps the first gate cap 60G and the drain cap 60D, such as shown in FIGS. 13 and 13A.

Figure 7:
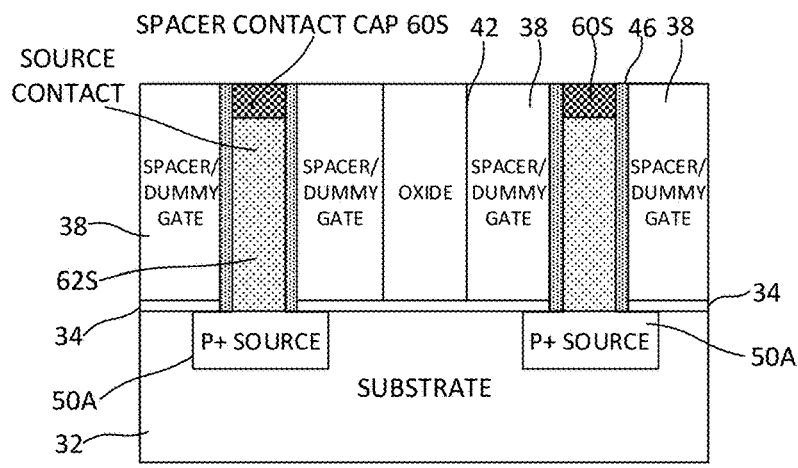
FIG. 7 is a schematic, cross-sectional view of the structure shown in FIG. 6 following formation of source contacts and dielectric caps on the source contacts.

A method of fabricating a tunnel field-effect transistor device includes obtaining a structure 30 including a semiconductor substrate 32 and a plurality of vertically extending mandrels 36 on the semiconductor substrate. Dummy gates 38 are formed as vertical spacers on sidewalls of the mandrels, such as illustrated in FIG. 2. The mandrels are removed after forming the dummy gates, thereby forming first vertical trenches 44 between pairs of the dummy gates 38 as shown in FIG. 4. First and second epitaxial source regions 50A are formed on the semiconductor substrate and first and second source contacts 62S are formed within the first vertical trenches 44. First and second source contact caps 60S are formed on the first and second source contacts. FIG. 7 shows the structure following formation of the source contacts and dielectric caps thereon. An epitaxial drain region 50B is formed on the semiconductor substrate. The conductivity type of the drain region is opposite to that of the source region. A drain contact 62D is formed on the epitaxial drain region 50B. The drain contact is comprised of electrically conductive material different that comprising the source contact. A drain contact cap is formed on the drain contact. A structure as schematically illustrated in FIG. 8 is obtained. The source and drain contact caps 60S and 60D comprise different dielectric materials that allow selective etching thereof during subsequent wiring. The dummy gates are removed and replaced by metal gate electrodes 58, gate dielectric layers 56 and dielectric gate caps 60G on the gate electrodes. The dielectric material comprising the gate caps 60G is different from the dielectric materials comprising the source and drain caps 60S, 60D to enable the selective etching thereof. The method may further include depositing a dielectric layer 54 over the first and second source contact caps, the drain cap, and the first gate cap as shown in FIG. 10. A first wiring trench 68 is formed in the dielectric layer, exposing top surfaces of the first and second source contact caps 60S, the drain cap 60D and gate caps 60G, as shown in FIG. 11. Portions of the first and second source contact caps 60S are removed selectively to the drain cap 60D and the gate caps 60G using a first selective etch. As shown in FIG. 12, recesses 70 down to the top surfaces of the source contacts 62S are formed by the selective etching of the portions of the source contact caps exposed by the wiring trench 68. Source wiring metal is deposited within the first wiring trench and on top surfaces of the first and second source contacts, thereby forming an electrically conductive source wiring strap electrically connecting two source contacts, as shown in FIGS. 13 and 13A.

A further method of fabricating a tunnel field-effect transistor device includes obtaining a structure 90 as exemplified by that shown in FIG. 9 An interlevel dielectric layer 54 is deposited over the source contact caps, the drain contact caps, and the gate caps and a first wiring trench is formed in the interlevel dielectric layer. (An exemplary wiring trench 68 is shown in FIG. 11.) Portions of at least one of the source contact caps 60S, the drain contact caps 60D and the gate caps 60G are selectively removed using a first selective etch selective to one of the first, second and third dielectric materials respectively comprising the caps. Wiring metal is then deposited within the first wiring trench. In some embodiments, at least two source contacts 62S, at least two drain contacts 62D or at least two gate electrodes 58 are exposed by the first selective etch. The deposited wiring metal thereby provides an electrical connection between at least two source contacts, at least two drain contacts or at least two gate contacts.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary devices illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having tunnel transistors therein formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this invention is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" or adjoining another layer, it will be understood that there may or may not be intermediate elements or layers between the two specified layers. If a layer is described as "directly on" another layer, direct contact of the two layers is indicated.

The corresponding structures, materials, acts, and equivalents of means or step-plus-function elements, if any, in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical invention. It is submitted with the understanding that it will not be used to interpret or limit the scope or meaning of the claims. In addition, in the foregoing Detailed Description, it can be seen that various features are grouped together in a single embodiment for the purpose of streamlining the invention. This method of invention is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a tunnel field-effect transistor device, comprising:
obtaining a structure including a semiconductor substrate and a plurality of vertically extending mandrels on the semiconductor substrate;
forming dummy gates on sidewalls of the mandrels;
removing the mandrels after forming the dummy gates, thereby forming first vertical trenches between pairs of the dummy gates;
forming first and second epitaxial source regions on the semiconductor substrate, the first and second epitaxial source regions having a first conductivity type;
forming first and second source contacts within the first vertical trenches, the source contacts being electrically connected to the first and second epitaxial source regions and comprising a first electrically conductive material;
forming first and second source contact caps comprising a first dielectric material on the first and second source contacts;
forming an epitaxial drain region on the semiconductor substrate, the drain region having a second conductivity type opposite from the first conductivity type;
forming a drain contact on the epitaxial drain region, the drain contact comprising a second electrically conductive material different from the first electrically conductive material;
forming a drain contact cap comprising a second dielectric material different from the first dielectric material on the drain contact;
removing the dummy gates;
depositing a gate dielectric layer over a channel region of the semiconductor substrate;
forming a first gate electrode on the gate dielectric layer; and
forming a first gate cap over the first gate electrode, the first gate cap comprising a third dielectric material different from the first and second dielectric materials, the method, further including:
depositing an interlevel dielectric layer over the first and second source contact caps, the drain cap, and the first gate cap;
forming a first wiring trench in the interlevel dielectric layer exposing top surfaces of the first and second source contact caps, the drain contact cap and the first gate cap;
removing portions of the first and second source contact caps selectively to the drain contact cap and the first gate cap using a first selective etch; and
depositing source wiring metal within the first wiring trench and on top surfaces of the first and second source contacts, thereby forming an electrically conductive source wiring strap electrically connecting the first and second source contacts.

2. The method of claim 1, further including:
forming sidewall spacers on the dummy gates.

3. The method of claim 1, further including:
forming a second gate electrode on the gate dielectric layer;
forming a second gate cap over the first gate electrode, the second gate cap comprising the third dielectric material,
wherein forming the first wiring trench in the interlevel dielectric layer causes exposure of a top surface of the second gate cap.

4. The method of claim 2, further including:
forming a second wiring trench within the interlevel dielectric layer extending down to the drain contact cap and over portions of the first and second gate caps;

removing a portion of the drain contact cap selectively to the first and second gate caps using a second selective etch; and depositing drain wiring metal within the second wiring trench and on a top surface of the drain contact.

5. The method of claim 4, further including:

forming a third wiring trench within the interlevel dielectric layer extending down to the first gate cap and over portions of the first contact cap and the drain contact cap;

removing a portion of the gate cap selectively to the first source cap and the drain contact cap using a third selective etch; and depositing gate wiring metal within the third wiring trench and on a top surface of the gate electrode.

6. The method of claim 5, further including:

forming sidewall spacers on the dummy gates.

7. The method of claim 6, further including:

forming a vertical trench between a pair of the dummy gates;

filling the vertical trench with a filling material having a different composition from the mandrels and dummy gates;

removing the filling material selectively with respect to the dummy gates, and wherein forming the drain contact includes depositing an electrically conductive liner comprising the second electrically conductive material and a metal layer on the liner.

8. A method of fabricating a tunnel field-effect transistor device, comprising:

obtaining a monolithic structure including one or more tunnel field-effect transistors, the monolithic structure further including:

a plurality of source contact caps respectively on a plurality of source contacts, the source contact caps comprising a first dielectric material;

a plurality of drain contact caps respectively on a plurality of drain contacts, the drain contact caps comprising a second dielectric material different from the first dielectric material, and a plurality of gate caps, the gate caps being respectively positioned over a plurality of gate electrodes and being comprised of a third dielectric material different from the first and second dielectric materials;

depositing an interlevel dielectric layer over the source contact caps, the drain contact caps, and the gate caps;

forming a first wiring trench in the interlevel dielectric layer;

selectively removing portions of at least one of the source contact caps, the drain contact caps and the gate caps using a first selective etch selective to one of the first, second and third dielectric materials; and depositing wiring metal within the first wiring trench, the wiring metal being electrically connected by at least one of the source contacts, the drain contacts and the gate electrodes to at least one of the one or more field-effect tunnel transistors.

9. The method of claim 8, wherein:

selectively removing portions of at least one of the source contact caps, the drain contact caps and the gate caps causes exposure of at least two source contacts, at least two drain contacts or at least two gate electrodes, and further wherein depositing the wiring metal within the first wiring trench provides an electrical connection between at least two source contacts, at least two drain contacts or at least two gate electrodes.

10. The method of claim 9, wherein:

the source contacts include a first electrically conductive liner and a first metal fill layer on the first electrically conductive liner, and the drain contacts include a second electrically conductive liner and a second metal fill layer on the second electrically conductive liner, the second electrically conductive liner having a different composition than the first electrically conductive liner.

* * * * *